US008274236B2

(12) United States Patent
Hu et al.

(10) Patent No.: US 8,274,236 B2
(45) Date of Patent: Sep. 25, 2012

(54) POWER SUPPLY HAVING AN AUXILIARY POWER STAGE FOR SUSTAINING SUFFICIENT POST IGNITION CURRENT IN A DC LAMP

(75) Inventors: Yuequan Hu, Morrisville, NC (US); Milan M. Jovanović, Cary, NC (US)

(73) Assignee: Delta Electronics, Inc., Taipei (TW)

( * ) Notice: Subject to any disclaimer, the term of this patent is extended or adjusted under 35 U.S.C. 154(b) by 576 days.

(21) Appl. No.: 12/416,687

(22) Filed: Apr. 1, 2009

(65) Prior Publication Data

US 2010/0253234 A1 Oct. 7, 2010

(51) Int. Cl.
*H03B 41/04* (2006.01)

(52) U.S. Cl. .................... 315/224; 315/200 R; 315/206; 315/219; 315/274; 315/279

(58) Field of Classification Search .......... 315/224–226, 315/106, 291, 219, 200 R, 209 R, 279, 308, 315/307, 206
See application file for complete search history.

(56) References Cited

U.S. PATENT DOCUMENTS

| | | | | |
|---|---|---|---|---|
| 5,343,125 | A | 8/1994 | Bernitz et al. | |
| 5,363,020 | A * | 11/1994 | Chen et al. | 315/209 R |
| 5,463,287 | A * | 10/1995 | Kurihara et al. | 315/307 |
| 5,828,177 | A * | 10/1998 | Toda et al. | 315/127 |
| 6,069,454 | A | 5/2000 | Bouwman et al. | |
| 6,294,879 | B1 | 9/2001 | Nagase et al. | |
| 7,291,983 | B2 * | 11/2007 | Hu et al. | 315/209 CD |
| 7,324,354 | B2 * | 1/2008 | Joshi et al. | 363/17 |
| 7,808,186 | B2 * | 10/2010 | Danjo et al. | 315/219 |
| 2004/0066153 | A1 * | 4/2004 | Nemirow et al. | 315/291 |
| 2006/0006818 | A1 * | 1/2006 | Fishbein et al. | 315/291 |
| 2008/0290808 | A1 * | 11/2008 | Danjo et al. | 315/206 |

FOREIGN PATENT DOCUMENTS

| | | |
|---|---|---|
| JP | 09-223591 | 8/1997 |
| JP | 2000-357597 | 12/2000 |

OTHER PUBLICATIONS

Lee, K-C. et al., "Design and Analysis of Automotive HID Lamp Ballast System Using Auxiliary Winding," IEEE, 2000, pp. 544-549.

* cited by examiner

*Primary Examiner* — Vibol Tan

(74) *Attorney, Agent, or Firm* — Venable LLP; Robert S. Babayi; Christopher Ma

(57) ABSTRACT

The current invention provides a power supply that includes an igniter that generates an ignition voltage for igniting a DC lamp; an auxiliary power stage that outputs an auxiliary voltage for sustaining sufficient current in the DC lamp after the DC lamp is ignited; a voltage conversion stage coupled to the auxiliary power stage and generating a voltage at a level that is higher than the auxiliary voltage; and a switch that couples the auxiliary voltage to the DC lamp and the voltage conversion stage for a predefined period of time.

20 Claims, 7 Drawing Sheets

POWER SUPPLY HAVING AN AUXILIARY POWER STAGE FOR SUSTAINING SUFFICIENT POST IGNITION CURRENT IN A DC LAMP

FIELD OF THE INVENTION

The present invention generally relates to power supplies and more particularly to power supplies that ignite and power high-intensity arc lamps.

BACKGROUND

High-intensity arc lamps emit light with extremely high brightness for use in projection display systems, for example, conference room projectors, home theatre projectors, etc. Such lamps are powered by a direct current (DC) voltage ranging from 12 V to 25 V and a DC current ranging from 20 A to 50 A. Operating the lamp requires a high voltage ignition pulse of up to 35 kV, depending on the temperature and gas pressure within the arc tube of the lamp. An arc sustaining circuit supplies a sufficient current that sustains the arc for turning on the lamp. As a result, a special power supply, known as a ballast, is utilized for these lamps.

FIG. 1 shows a block diagram of a known high-intensity arc lamp ballast that powers a lamp 107 by an alternating current (AC) power source 101. The lamp ballast is composed of an EMI filter 102, a bridge rectifier 103, a power factor correction (PFC) circuit 104, a DC/DC voltage converter 106, an auxiliary power supply 108, an arc sustaining circuit 109, and an igniter 110. The PFC circuit 104 converts an AC input voltage 101 to a DC voltage, i.e., $V_B$ of 380 V~400 V, and shapes the input current to reduce its harmonic contents and improve system efficiency. The full-bridge converter 106 converts DC voltage $V_B$ to a voltage required by lamp 107. The auxiliary power supply 108 generates suitable voltages for igniter 110 and arc sustaining of lamp 107.

More detailed description of the ballast circuit of prior art for high-wattage arc lamps can be made by referring to FIG. 2. The PFC stage is not shown in the figure and well known by those skilled in the art. Both full-bridge DC/DC converter 209 and auxiliary power supply 108 (e.g. a flyback converter) receives PFC output voltage $V_B$ as the input. The full-bridge DC/DC converter 209 is composed of switches Q3-Q6, DC voltage blocking capacitor Cb, transformer T4, diodes D1 and D2, and inductor Lig. Because lamp 107 has aging effect, i.e., the lamp impedance increases with time, full-bridge DC/DC converter 209 powers lamp 107 preferably with a constant-power control during normal operation to avoid excessive lamp power when a constant-current control is used. Flyback converter 108 converts $V_B$ to $V_{C1}$ to provide an input for igniter 110 and an arc sustaining current through switch Q2 and current-limiting resistor R1 right after the lamp ignition.

When switch Q2 is turned on, the voltage at the cathode of diodes D1 and D2 becomes voltage $V_{C1}$. The voltage at the anode of diodes D1 and D2 is the voltage across the secondary winding of transformer T4, which is equal to $V_B \cdot (N_s/N_p)$, where $N_p$ and $N_s$ are the turn numbers of the primary and secondary windings of transformer T4, respectively. Voltage $V_{C1}$ is typically in the range of 100 V~200 V and ensures adequate arc sustaining current after lamp 107 is ignited. Assuming a $V_B$ of 400 V and an $N_s/N_p$ ratio of 3/28, the voltage at the anode of diodes D1 and D2 would be 43 V. This voltage ensures that diodes D1 and D2 do not conduct when switch Q2 is turned on since both diodes are reverse biased.

Igniter 110 of FIG. 2 has two stages. The first stage includes a resistor Rig1, energy storage capacitor Cig1, silicon diode for alternating current (SIDAC) 226, and transformer T1. SIDAC 226 conducts current in either direction but only after its breakdown voltage has been reached. Before lamp 107 is ignited, switch Q2 is turned on, and voltage $V_{C1}$ provides a charging current which flows through switch Q2, resistor R1, and resistor Rig1 to charge capacitor Cig1. When the increased voltage across capacitor Cig1 turns on SIDAC 226, a voltage pulse is generated across the secondary winding of transformer T1, which charges storage capacitor Cig2. Capacitor Cig1 discharges quickly as SIDAC 226 conducts current. The voltage across capacitor Cig1 is charged up again when SIDAC 226 turns off as the current flowing through SIDAC 226 is lower than its holding current. This operation continues as long as switch Q2 remains on. The second stage of igniter 110 includes spark-gap 219, diode 227, and transformer T2. Once the voltage across capacitor Cig2 reaches the break-over voltage of spark-gap 219, a voltage pulse is generated across the secondary winding Lig of transformer T2 to strike lamp 107. The benefit of using a two-stage igniter is that the input voltage at the primary side of ignition transformer T2 is boosted by the first stage, thereby allowing the use of a lower turns ratio for the secondary-to-primary winding of transformer T2. A lower number of secondary turns decreases power loss at high current for lamp 107. The turning on or off of switch Q2 is controlled by a control circuit 229.

After lamp 107 is ignited, switch Q2 is kept on for a period of 100 μs-500 μs before it is turned off. During this period, energy-storage capacitor C1 is discharged, and a current flows through switch Q2, resistor R1, and winding Lig to sustain the arc in lamp 107. When the ignition period is over, igniter 110 stops generating voltage pulses as the maximum voltage across capacitor Cig1 becomes comparable with the operating voltage of lamp 107, which is well below the turn-on threshold of SIDAC 226. Meanwhile, spark-gap 219 is turned off, leading to an open-circuit condition for the primary side of transformer T2. Thus, the secondary winding of transformer T2 and its magnetic core form an inductor Lig. After switch Q2 is turned off, full-bridge DC/DC converter 209 takes over and provides the required DC current through inductor Lig for operating lamp 107.

As can be seen from FIG. 2, before lamp 107 is ignited, the voltage across diodes D1 and D2 is the sum of voltage $V_{C1}$ and the reflected voltage $V_B \cdot (N_s/N_p)$ across the secondary winding of transformer T4. As a result, diodes D1 and D2 should have a voltage rating higher than the sum of $V_B \cdot (N_s/N_p)$ and $V_{C1}$.

Assuming the voltage rating of diodes D1 and D2 is $V_D$, $V_{C1}$ needs to be lower than $V_D - V_B \cdot (N_s/N_p)$ to ensure safe operation of these output diodes. Therefore, voltage $V_{C1}$ for the igniter input is ultimately limited by the voltage rating of diodes D1 and D2. This leads to the choice of either larger size and less reliable igniters or output diodes with high voltage ratings but an accompanying higher power loss of the diodes and subsequent significant loss of efficiency.

Therefore, there exists a need for a power supply having low power loss and high efficiency for igniting and powering a lamp with an arc sustaining circuit.

SUMMARY

Briefly, according to some embodiments of the present invention, a power supply for a DC lamp comprises an igniter, an arc sustaining circuit, an auxiliary power stage, a voltage conversion stage, and a full-bridge DC/DC converter. The igniter generates an ignition voltage for igniting the DC lamp. The auxiliary power stage outputs an auxiliary voltage for sustaining sufficient current in the DC lamp after the DC lamp is ignited. The voltage conversion stage coupled to the auxiliary power stage generates a voltage at a level that is higher than the auxiliary voltage and a switch couples the auxiliary voltage to the DC lamp and voltage conversion stage for a predefined period of time.

According to some of the more detailed features of the present invention, a control circuit controls the switch in response to detection of a drop of the auxiliary voltage after the DC lamp is ignited and the voltage conversion stage comprises a voltage multiplier. The auxiliary power stage can be a flyback power stage with at least one of a secondary winding or an auxiliary winding and a DC/DC converter that is coupled to the DC lamp after the predefined period, with the converter having output diodes with ratings commensurate with the auxiliary voltage.

DETAILED DESCRIPTION OF THE EMBODIMENTS

Figure 3:
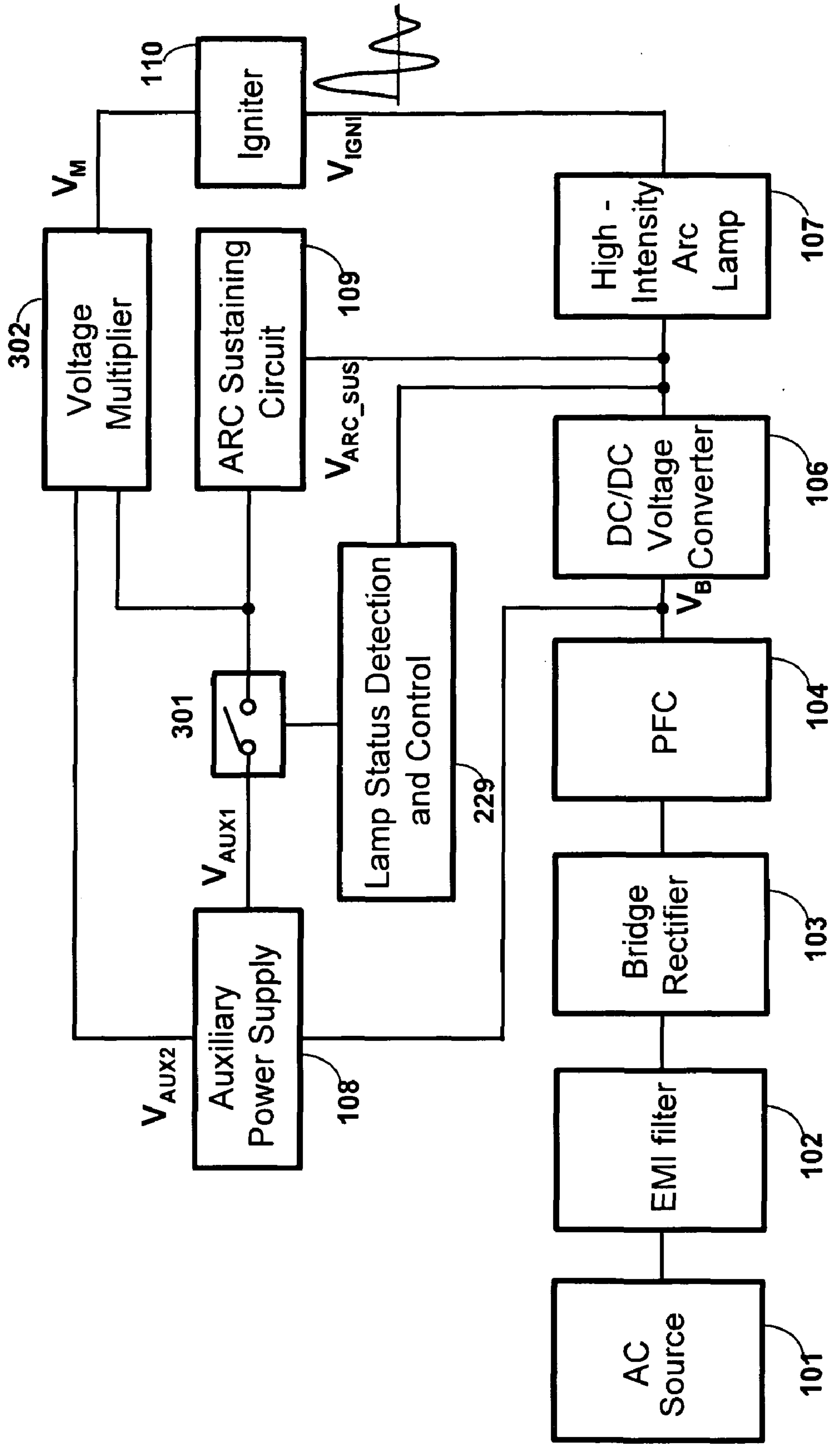
FIG. 3 shows a block diagram of a power supply for igniting and sustaining the ignition arc according to an exemplary embodiment of the invention.

FIG. 3 shows a block diagram for an arc-lamp ballast that incorporates an exemplary embodiment of the invention. The lamp ballast is composed of an EMI filter 102, a bridge rectifier 103, a PFC circuit 104, a DC/DC voltage converter 106, an auxiliary power supply 108, an arc sustaining circuit 109, a voltage multiplier 302, a lamp status and control circuit 229, and an igniter 110. Voltage $V_{AUX1}$ is for providing an arc-sustaining current after the lamp ignition and also serves as one input of voltage multiplier 302. Voltage $V_M$ is for driving igniter 110. These two voltages are generated from auxiliary power supply 108 independently. Switch 301 is used to connect/disconnect one of the auxiliary outputs, i.e., $V_{AUX1}$, to/from voltage multiplier 302 and arc sustaining circuit 109. Auxiliary output voltage $V_{AUX2}$ is connected to voltage multiplier 302. Before the lamp ignition, switch 301 is turned on by lamp status detection and control circuit 229 to provide an input voltage for voltage multiplier 302 and a path for arc sustaining current 109 to flow right after the lamp ignition. As voltage $V_M$ increases, an ignition pulse is generated at the output of igniter 110 to ignite lamp 107. After lamp 107 is ignited and turned on for a few hundred microseconds, switch 301 is turned off so that no arc sustaining current continues to flow to lamp 107 and voltage $V_{AUX1}$ is disconnected from multiplier 302. Output voltage $V_M$ of voltage multiplier 302 then decreases and no further ignition pulse is generated during normal operation of lamp 107. The DC/DC voltage converter 106 takes over and continues to provide driving current for lamp 107 immediately after arc sustaining circuit 109 stops the current flow.

Figure 4:
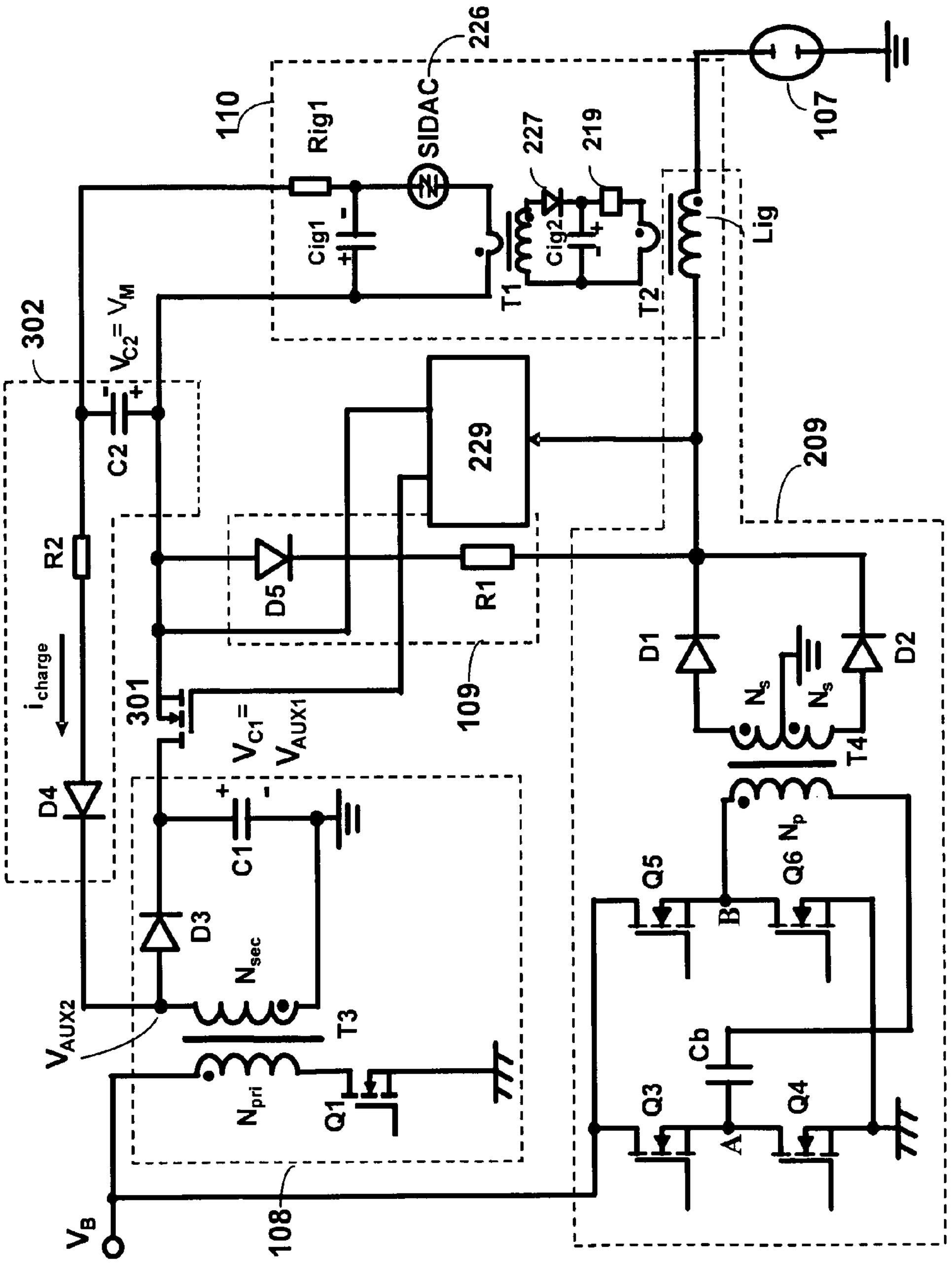
FIG. 4 shows one exemplary circuit diagram in the embodiment of FIG. 3.

FIG. 4 shows one exemplary circuit implementing full-bridge DC/DC converter 209, auxiliary power supply 108, voltage multiplier 302, arc sustaining circuit 109, and igniter 110. Full-bridge DC/DC voltage converter 209 and auxiliary power supply 108 are powered by DC voltage $V_B$, which can be the output of a PFC stage (not shown). Auxiliary power supply 108 serves two functions. The first function is to generate igniter input voltage $V_M$ at the output of voltage multiplier 302. The other is to provide an arc sustaining voltage immediately after lamp 107 is ignited. In FIG. 4, the input of igniter 110 is generated across capacitor C2. Under this arrangement, igniter voltage $V_M$ equals $V_{C2}$ and voltage $V_{AUX1}$, generated across capacitor C1, equals $V_{C1}$. An arc sustaining current flows through switch 301, diode D5, and current limiting resistor R1. Full-bridge DC/DC converter 209 converts voltage $V_B$ (e.g. 380 V~400 V DC) to a voltage required by lamp 107 during normal operation.

After DC voltage $V_B$ is applied to the input of auxiliary power supply 108, auxiliary power converter 108 starts operating and switch 301 is also turned on. When switch Q1 is turned on, the secondary winding of flyback transformer T3 induces a negative voltage $V_{AUX2}$ at the anode of diode D3 so that diode D3 is turned off since it is reverse biased. At the same time, diode D4 is forward biased and current $i_{charge}$ flows through the secondary winding of flyback transformer T3, capacitor C1, switch 301, capacitor C2, and resistor R2, charging capacitor C2. During conduction of switch Q1, magnetic energy is stored in flyback transformer T3.

When switch Q1 is turned off, the secondary winding of flyback transformer T3 induces a positive voltage at the anode of diode D3 so that diode D3 starts conducting and diode D4 is turned off. As a result, the stored magnetic energy is released into capacitor C1, increasing the voltage across capacitor C1. This operation continues until voltage $V_{C1}$ across capacitor C1, reaches a preset voltage.

During the conducting period of switch Q1, voltage $V_{AUX2}$ at the anode of diode D3, referred to the secondary ground, is:

$$V_{AUX2} = -\frac{N_{sec}}{N_{pri}} V_B,$$

where $N_{pri}$ and $N_{sec}$ are the primary and secondary turns number of flyback transformer T3, respectively. As a result, voltage $V_{C2}$ across capacitor $C_2$, i.e., the igniter input voltage $V_M$ is:

$$V_M = V_{C2} = V_{AUX1} - V_{AUX2} = V_{C1} + V_B(N_{sec}/N_{pri}) \quad (1)$$

where $V_{C1}$ is the voltage across capacitor $C_1$, $V_{C2}$ is the voltage across capacitor $C_2$, and $V_B$ is the bus voltage provided by PFC circuit 104.

As can be seen from the above equation 1, igniter input voltage $V_M$ is always higher than arc sustaining voltage $V_{C1}$. In one exemplary embodiment, arc sustaining voltage $V_{C1}$ is in the range of 100 V-200 V. This level provides adequate arc sustaining current after lamp 107 is ignited. However, the voltage at the anode of diodes D1 and D2 is much lower, e.g., 43 V for $V_B$=400 V and $N_s/N_p$=3/28. This results in diodes D1 and D2 being reverse biased while switch 301 remains turned on.

The exemplary embodiment of igniter 110 of the current invention includes two stages. In the first stage, capacitor Cig1 is charged by voltage $V_{C2}$ through resistor Rig1. When the voltage across capacitor Cig1 reaches the turn-on threshold of SIDAC 226, SIDAC 226 starts conducting and generates a voltage pulse across the secondary winding of transformer T1 to charge storage capacitor Cig2 in the second stage. Once the voltage across capacitor Cig2 reaches the break-over voltage of spark-gap 219, spark-gap 219 turns on and a voltage pulse is generated across the secondary winding of transformer T2 to strike lamp 107 with an ignition voltage pulse.

Once ignited, lamp 107 exhibits low impedance, and a discharging current of capacitor C1 flows to lamp 107 through switch 301, diode D5, and resistor R1. This leads to a sudden drop of voltage $V_{C1}$. The lamp status detection and control circuit 229 detects the drop and after a predefined delay turns off switch 301. The delay enables the discharging current of storage capacitor C1 to flow through lamp 107 and sustain the arc in lamp 107. Resistor R1 limits the discharging current to prevent damage to lamp 107. Diode D5 prevents capacitor C2 from being charged by the voltage at the cathode of diodes D1 and D2, thereby avoiding undesired operation of igniter 110 after lamp 107 is turned on.

In the embodiment of the invention as shown in FIG. 4, the arc sustaining voltage is $V_{C1}$ and the igniter input voltage is $V_{C2}$, where $V_{C2}$ is higher than $V_{C1}$ according to equation 1. The maximum rating voltage for diodes D1 and D2 is:

$$V_D=V_B(N_s/N_p)+V_{C1}. \quad (2)$$

Figure 1:
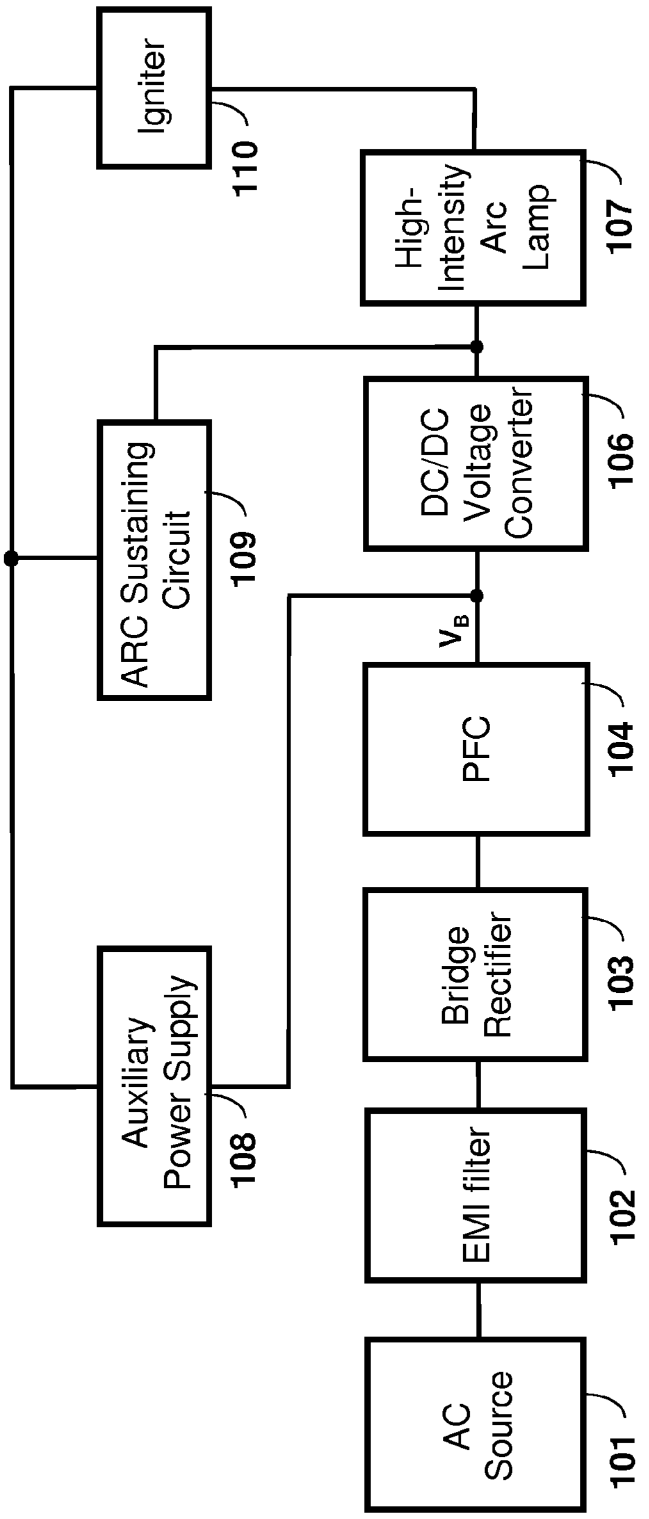
FIG. 1 (PRIOR ART)
FIG. 1 shows a block diagram of a conventional ballast for a high-intensity arc lamp.
Figure 2:
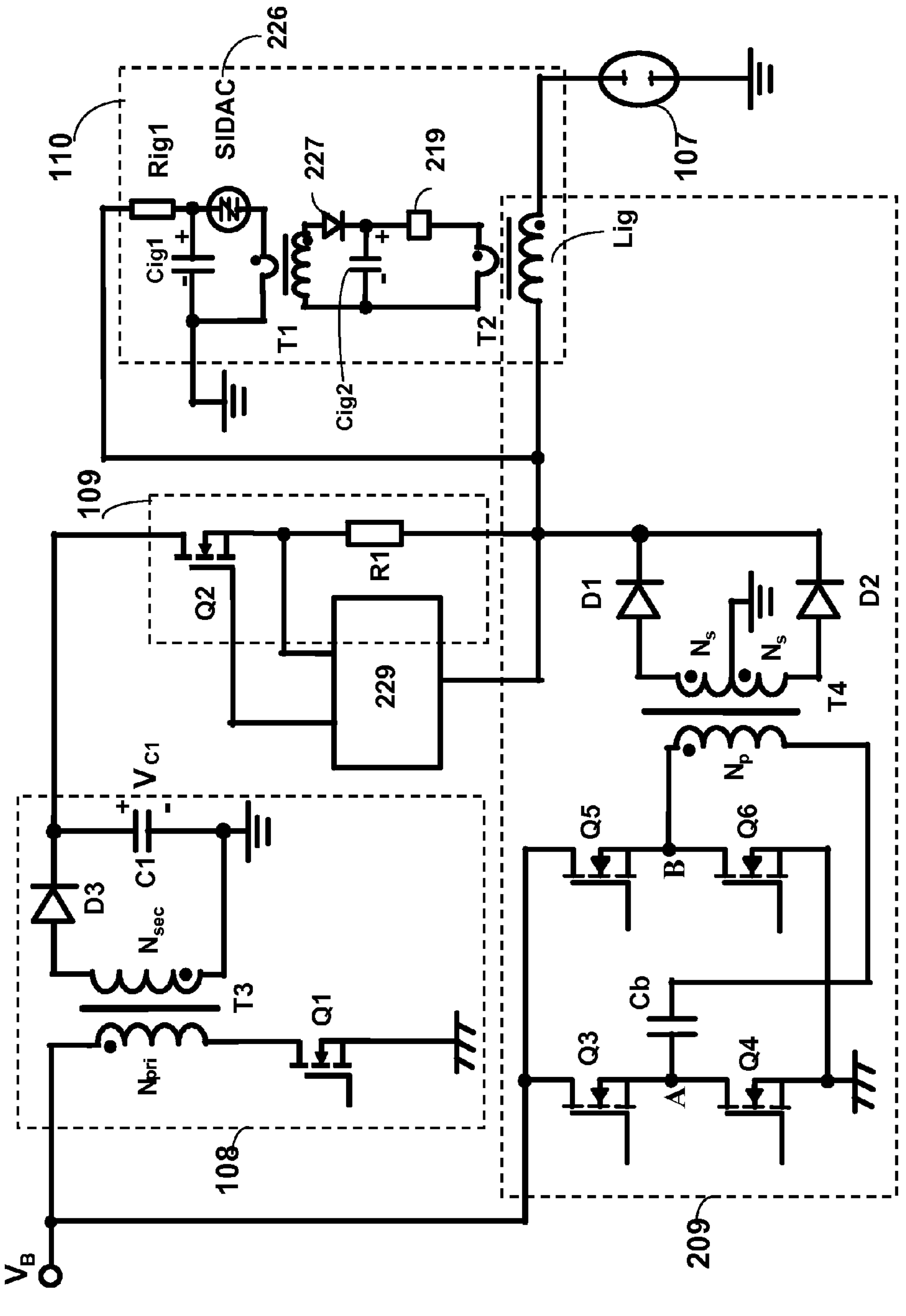
FIG. 2 (PRIOR ART)
FIG. 2 shows further details of the block diagram of FIG. 1.

For example, assuming an arc sustaining voltage $V_{C1}$ of 100 V, a $V_B$ of 400 V, an $N_p$ of 28, and an $N_s$ of 3, the reverse bias voltage across diodes D1 and D2 is 145 V. In comparison, the circuit of FIG. 2 with a $V_{C1}$ of 200V under similar conditions has a reverse bias voltage of 243 V across diodes D1 and D2, almost 100 V higher. As a result, the current invention enables the use of output diodes with much lower voltage ratings than known in the art while providing much higher igniter input voltage.

In the exemplary embodiment of FIG. 4, diodes with lower than 200 V ratings, such as Schottky diodes with low forward voltage drop and fast recovery, can be used to implement the present invention. Therefore, the power loss associated with the output diodes is reduced significantly.

Moreover, in FIG. 4, by selecting an $N_{pri}$ of 102 and an $N_{sec}$ of 63, voltage $V_M$(=$V_{C2}$), at the input of voltage multiplier 302, can be as high as 350 V. With higher voltage $V_M$ supplied to igniter 110, SIDAC 226 can have a higher breakdown voltage, leading to a higher primary voltage pulse for transformer T1 when SIDAC 226 is turned on. A higher voltage pulse across the primary winding of transformer T1 enables the use of lower secondary-to-primary turns ratios, leading to reduction of the sizes of transformers T1 or T2. With a lower secondary-to-primary turns ratio, transformer T2 can use a smaller turns number for its secondary winding Lig, resulting in a significant reduction of power loss of secondary winding Lig when the current through lamp 107 is high.

Finally, according to some embodiments of the current invention, energy storage capacitor Cig2 can be charged to a higher voltage because of the higher primary voltage of transformer T1. This significantly reduces the probability of failure to fire spark-gap 219 resulting from tolerance of the break-over voltage and aging effect of SIDAC 226.

While arc sustaining circuit 109 can be implemented by a flyback transformer, any suitable arrangement may be used, including providing igniter input voltage $V_M$ via a variety of voltage multipliers.

Figure 5:
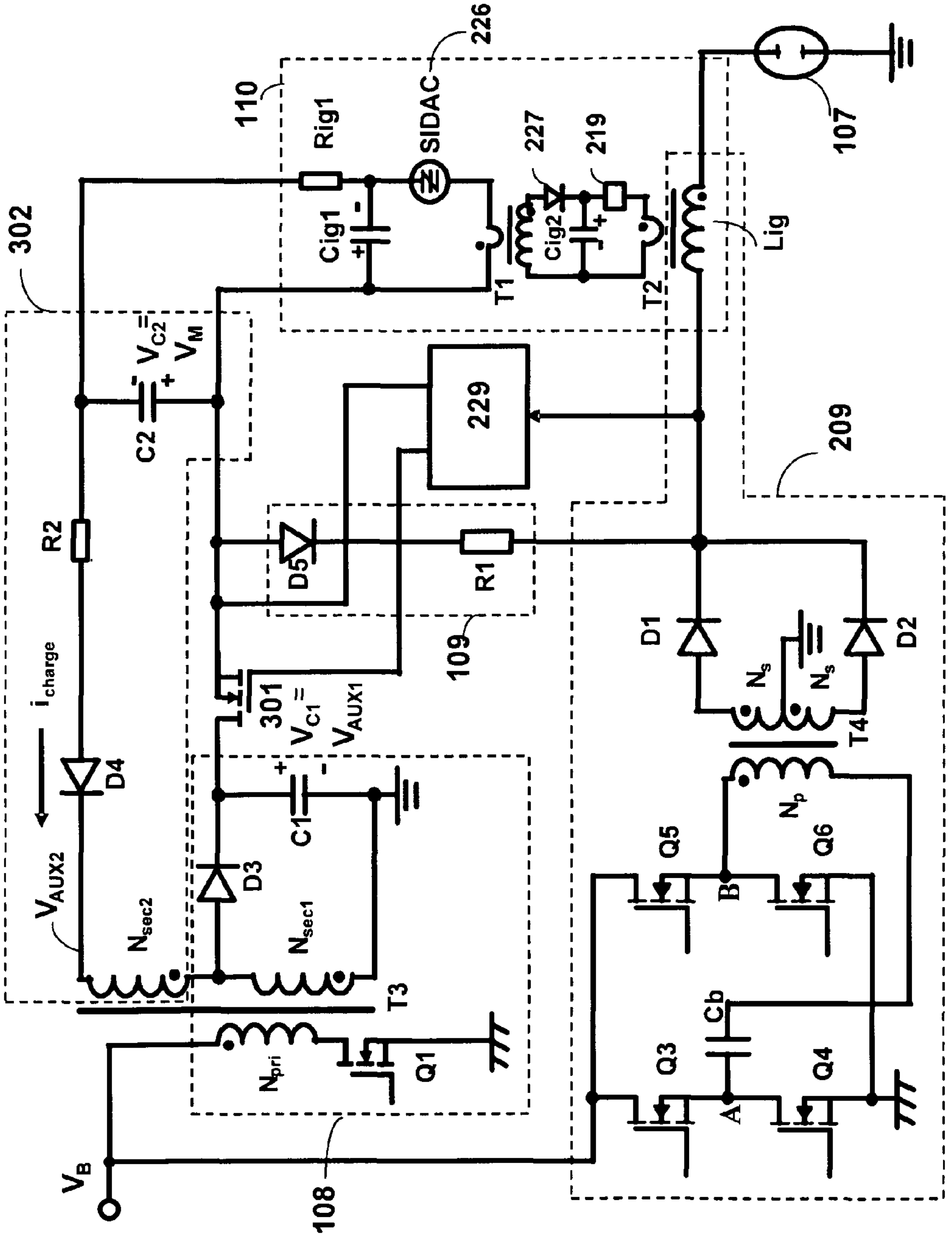
FIG. 5 shows another exemplary circuit diagram in the embodiment of FIG. 3.

FIG. 5 shows another exemplary implementation according to the invention. Capacitor C2 is charged by voltage $V_{C1}$ and the voltages across the secondary winding of flyback transformer T3, when switch 301 is turned on. In this embodiment, the igniter input voltage is:

$$V_M=V_{C2}=V_{C1}+V_B(N_{sec1}+N_{sec2})/N_{pri}, \quad (3)$$

where $N_{sec1}$ and $N_{sec1}$ are the turns number of the first and second secondary winding of flyback transformer T3, respectively. With an arc sustaining voltage $V_{C1}$ of 100 V and $V_B$ of 400 V, the reverse bias voltage across output diodes D1 and D2 is approximately 145 V, if $N_p$=28 and $N_s$=3. Meanwhile, voltage $V_{C2}$ can be as high as 594 V by selecting $N_{pri}$102, $N_{sec1}$=63, and $N_{sec2}$=63. Adjusting $N_{sec2}$ can lead to a desired input voltage for igniter 110.

Figure 6:
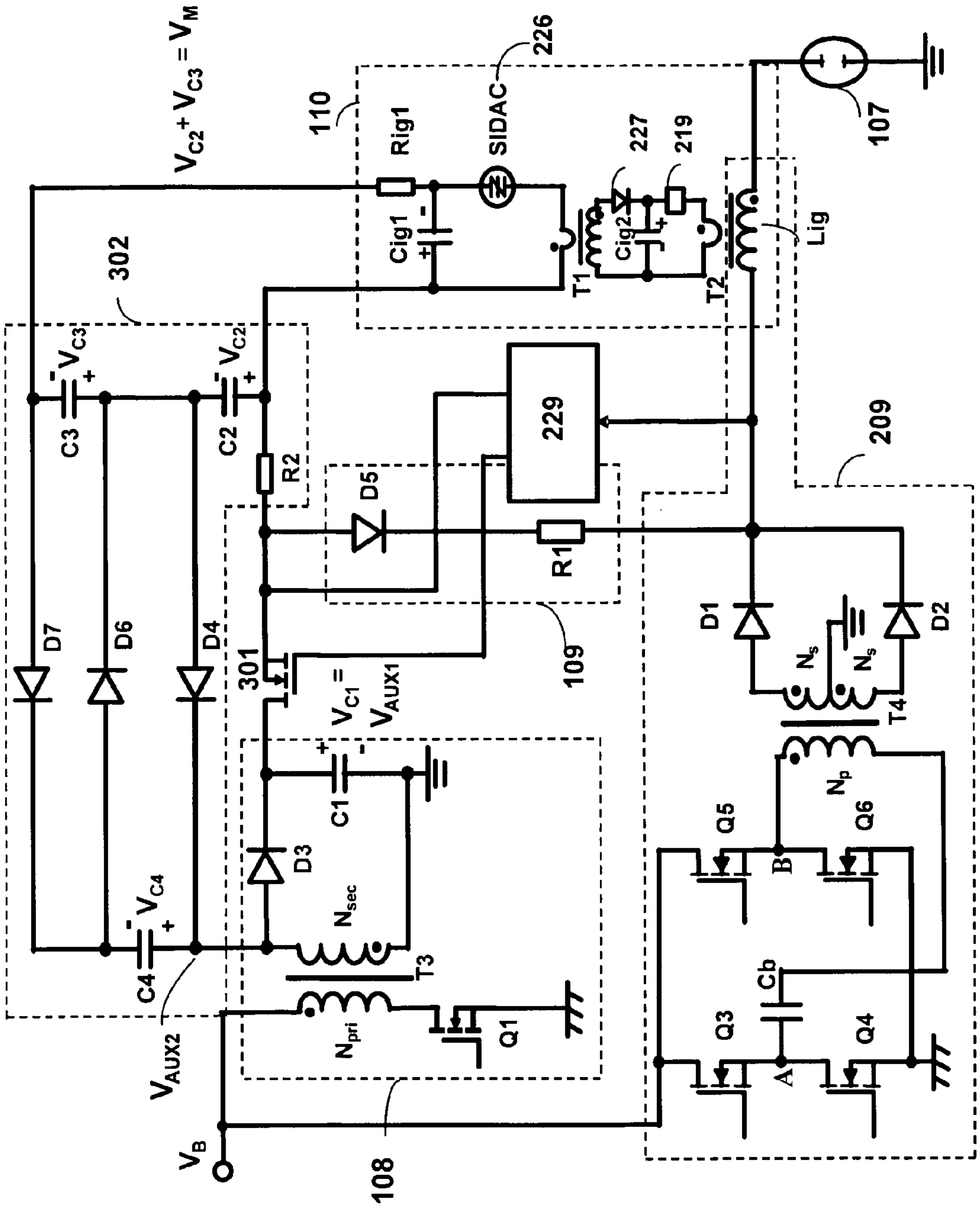
FIG. 6 shows still another exemplary circuit diagram in the embodiment of FIG. 3.

FIG. 6 shows still another exemplary implementation according to the invention where the igniter input voltage $V_M$ is:

$$V_M=V_{C2}+V_{C3}=2(V_{C1}+V_B\cdot N_{sec}/N_{pri}). \quad (4)$$

Output diodes D1 and D2 still exhibit a voltage stress of approximately 145 V, whereas the input voltage for igniter 110 can be as high as 694 V if $V_{C1}$=100 V, $V_B$=400 V, $N_{pri}$=102, and $N_{sec}$=63. This embodiment requires capacitors C2, C3 and C4 to have a voltage rating of at least the sum of $V_{C1}$ and $V_BN_{sec}/N_{pri}$.

An even higher voltage rating can be obtained with further extensions to voltage multiplier 302 in FIG. 6.

Figure 7:
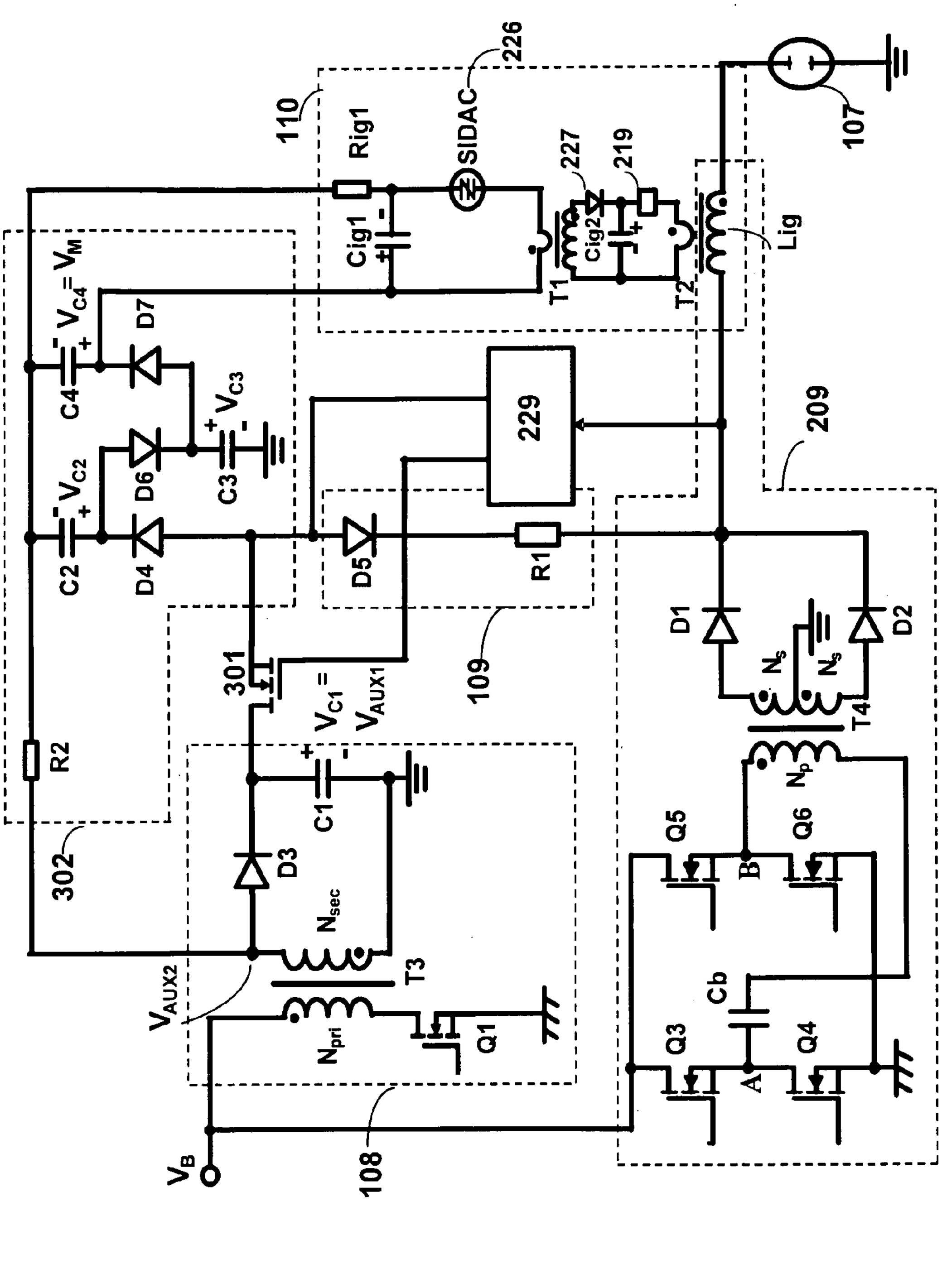
FIG. 7 shows yet another exemplary circuit diagram in the embodiment of FIG. 3.

FIG. 7 shows yet another exemplary implementation according to the invention where the igniter input voltage $V_M$ is:

$$V_M=V_{C4}=2(V_{C1}+V_BN_{sec}/N_{pri}). \quad (5)$$

The voltage stress for output diodes D1 and D2 is the same as that in FIG. 6. However, this embodiment requires capacitors C3 and C4 to have a higher voltage rating. Specifically, a voltage rating of at least $2V_{C1}+V_BN_{sec}/N_{pri}$ for capacitor C3 and a voltage rating of $2(V_{C1}+V_BN_{sec}/N_{pri})$ for capacitor C4, respectively. Persons of ordinary skill in the art will know how to achieve even higher voltage rating with further extension to voltage multiplier 302 in FIG. 7 by following the true spirit of this invention.

The examples and embodiments described herein are non-limiting examples. The invention is described in detail with respect to exemplary embodiments, and it will now be apparent from the foregoing to those skilled in the art that changes and modifications may be made without departing from the invention in its broader aspects, and the invention, therefore, as defined in the claims is intended to cover all such changes and modifications as fall within the true spirit of the invention.

What is claimed is:

1. A power supply for a DC lamp, comprising:

an igniter that generates an ignition voltage for igniting the DC lamp;

an auxiliary power stage that outputs an auxiliary voltage for sustaining sufficient current in the DC lamp after the DC lamp is ignited;

a voltage conversion stage coupled to said auxiliary power stage, said voltage conversion stage generating an output voltage at a level that is higher than said auxiliary voltage; and a switch that couples the auxiliary voltage to the DC lamp for a predefined period of time after the DC lamp is ignited.

2. The power supply as set forth in claim 1, further comprising a control circuit that controls said switch in response to detection of a drop of the auxiliary voltage after the DC lamp is ignited.

3. The power supply as set forth in claim 1, wherein said voltage conversion stage comprises a voltage multiplier.

4. The power supply as set forth in claim 1, wherein said auxiliary power stage comprises a flyback power stage with at least one of a secondary winding or an auxiliary winding.

5. The power supply as set forth in claim 1, further comprising a DC/DC converter that is coupled to the DC lamp after the predefined period after the DC lamp is ignited.

6. The circuit as set forth in claim 5, wherein the DC/DC converter further comprises at least one output diode with a voltage rating commensurate with the auxiliary voltage.

7. The power supply as set forth in claim 1, wherein the output voltage is coupled in series with the auxiliary voltage to generate an igniter input voltage, wherein said igniter generates the ignition voltage using the igniter input voltage.

8. The power supply as set forth in claim 1, wherein said auxiliary power stage outputs a second auxiliary voltage and said voltage conversion stage comprises an input receiving the second auxiliary voltage.

9. A power supply for a DC lamp, comprising:
- an auxiliary power stage that outputs an auxiliary voltage for sustaining sufficient current in the DC lamp after the DC lamp is ignited;
- a voltage conversion stage coupled to said auxiliary power stage, said voltage conversion stage generating an output voltage coupled in series with the auxiliary voltage to generate an igniter input voltage;
- a switch that couples the auxiliary voltage to the DC lamp for a predefined period of time after the DC lamp is ignited; and
- an igniter that generates an ignition voltage for igniting the DC lamp using the igniter input voltage.

10. The power supply as set forth in claim 9, further comprising a control circuit that controls said switch in response to detection of a drop of the auxiliary voltage after the DC lamp is ignited.

11. The power supply as set forth in claim 9, wherein said voltage conversion stage comprises a voltage multiplier.

12. The power supply as set forth in claim 9, wherein said voltage conversion stage generates the output voltage at a level that is higher than said auxiliary voltage.

13. The power supply as set forth in claim 9, wherein said auxiliary power stage outputs a second auxiliary voltage, wherein said voltage conversion stage has an input receiving the second auxiliary voltage.

14. The circuit as set forth in claim 9, further comprising a DC/DC converter that is coupled to the DC lamp after the predefined period after the DC lamp is ignited, wherein the DC/DC converter further comprises at least one output diode with a voltage rating commensurate with the auxiliary voltage.

15. A power supply for a DC lamp, comprising:
- an igniter that generates an ignition voltage for igniting the DC lamp;
- an auxiliary power stage that outputs an auxiliary voltage for sustaining sufficient current in the DC lamp after the DC lamp is ignited and outputs a second auxiliary voltage;
- a voltage conversion stage coupled to said auxiliary power stage and having an input receiving the second auxiliary voltage, said voltage conversion stage generating an output voltage from the second auxiliary voltage; and
- a switch that couples the auxiliary voltage to the DC lamp for a predefined period of time after the DC lamp is ignited.

16. The power supply as set forth in claim 15, further comprising a control circuit that controls said switch in response to detection of a drop of the auxiliary voltage after the DC lamp is ignited.

17. The power supply as set forth in claim 15, wherein said voltage conversion stage comprises a voltage multiplier.

18. The power supply as set forth in claim 15, wherein said voltage conversion stage generates the output voltage at a level that is higher than said auxiliary voltage.

19. The power supply as set forth in claim 15, wherein the output voltage is coupled in series with the auxiliary voltage to generate an igniter input voltage, wherein said igniter generates the ignition voltage using the igniter input voltage.

20. The circuit as set forth in claim 15, further comprising a DC/DC converter that is coupled to the DC lamp after the predefined period after the DC lamp is ignited, wherein the DC/DC converter further comprises at least one output diode with a voltage rating commensurate with the auxiliary voltage.

* * * * *